United States Patent [19]
Roberge

[11] Patent Number: 4,680,554
[45] Date of Patent: Jul. 14, 1987

[54] REAL TIME NETWORK RECEIVER SYSTEM FAST SETTLING AMPLIFIER

[75] Inventor: James K. Roberge, Lexington, Mass.

[73] Assignee: Aetna Telecommunications Laboratories, Westboro, Mass.

[21] Appl. No.: 779,945

[22] Filed: Sep. 25, 1985

[51] Int. Cl.$^4$ .......................... M03F 3/45; M03F 1/34
[52] U.S. Cl. .................................... 330/260; 307/356; 330/294; 330/308
[58] Field of Search ................. 330/59, 252, 259, 260, 330/261, 294, 308; 307/354, 355, 356

[56] References Cited

U.S. PATENT DOCUMENTS 3,463,939  8/1969  Sturman ............................ 307/355
4,529,947  7/1985  Biard et al. ..................... 330/260 X

OTHER PUBLICATIONS

Borberly, E. and Baungartner, J. D., "A Low Frequency Amp for Large Power Outputs", *Elektronik Industrie*, Apr. 1976, pp. 81–82.

*Primary Examiner*—Eugene R. LaRoche
*Assistant Examiner*—Steven J. Mottola
*Attorney, Agent, or Firm*—Weingarten, Schurgin, Gagnebin & Hayes

[57] ABSTRACT

A fast settling amplifier for use in a phase locking system operative to phase lock a local clock to incoming data bits in a packet of short duration within a specified accuracy range, using no more than a few initial bits of the packet. Phase locking is achieved by phase shifting the data packet bits relative to a local clock signal a fixed, non-integral fraction of a bit period until the phasing lies within the specified range. The phasing is then accurate enough to permit signal decoding with an open loop over the limited duration of the packet. The phase locking process is activated each time the beginning of a new packet is detected. A Manchester code is typically utilized as the representation of the signal upon which synchronization is achieved. The Manchester code or biphase signal is recovered from the telecommunications network by a fast settling amplifier that rapidly establishes thresholding to accurately distinguish between high and low level signal levels in the Manchester code while maintaining a well filtered signal level.

11 Claims, 8 Drawing Figures

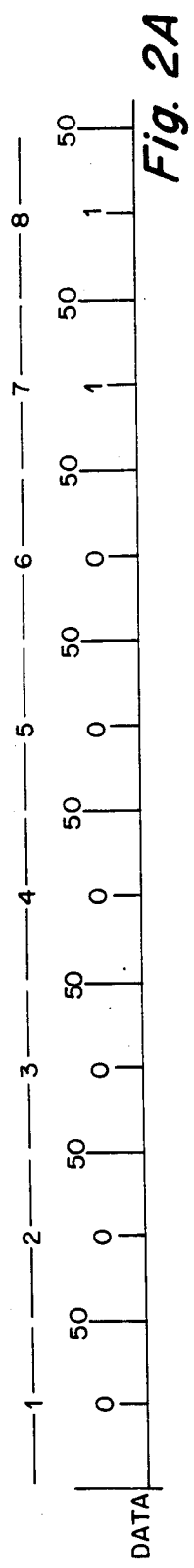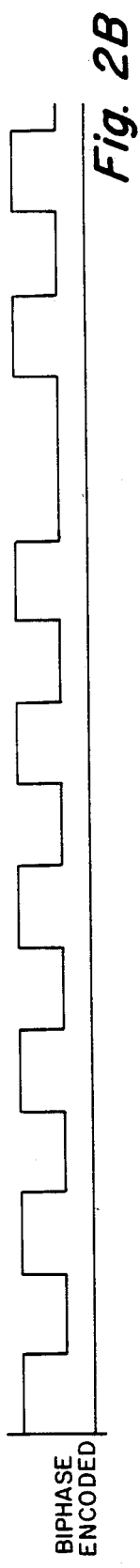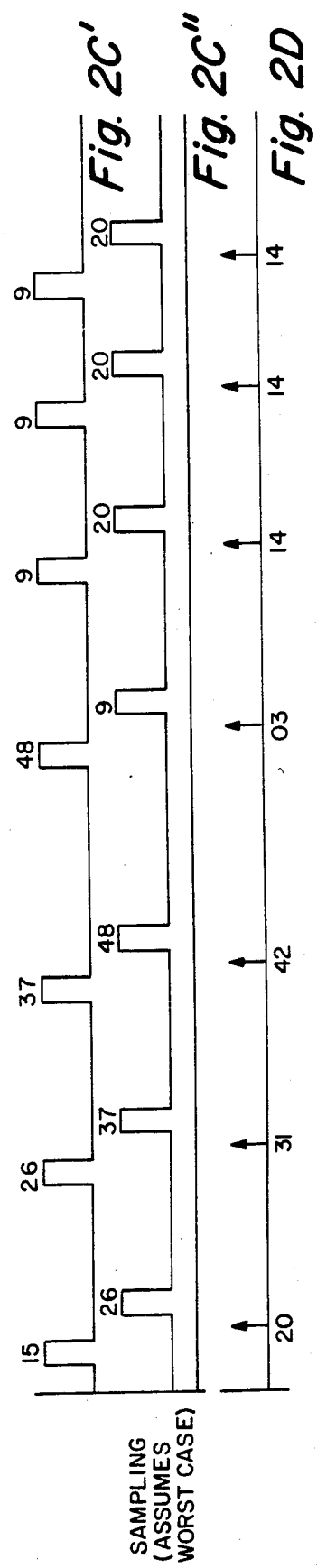

REAL TIME NETWORK RECEIVER SYSTEM FAST SETTLING AMPLIFIER

FIELD AND BACKGROUND OF THE INVENTION

There are various systems for synchronizing or phase locking a local clock to an incoming data stream in order to be able to properly identify one bit of data from another. Common in such systems are phase locked loops which operate to initially adjust the phasing of a local oscillator to the leading or trailing edge of a bit interval in the incoming data with great accuracy. A phase locked loop is then closed around the local oscillator with a bit detector that operates to control the local oscillator phasing continuously to maintain a high level of synchronization between the local clock and the incoming data.

Such systems are capable of attaining and maintaining very accurate phase control of the local oscillator over extended periods of time. One drawback of such systems, or indeed of other systems that are designed to maintain long term oscillator lock, is the length of time needed for the synchronization system to initially achieve phase locking. This time can be microseconds in length, for example 6.4 microseconds is required for synchronization in ETHERNET running at 10 MHz. Such time intervals may not be objectionable where normal lengths of data packets are involved.

A data packet is the group of digital signals exchanged between stations on a telecommunications network before the stations relinquish their connection to permit another set of stations to communicate over the same channel. Long packets are desirable where data is being exchanged and there is no need for real time information exchange.

Where voice signals are being exchanged on a digital signal path, however, there is a need to maintain both real time communication and short data packets to insure that the voice retains its natural sound and the exchange between parties is conversational. In this case, the entire data packet may typically be about 25 microseconds in length. Here a synchronization interval of several microseconds would create an intolerable inefficiency. A 6.4 microsecond synchronization interval would waste 25 percent of the data time.

Before synchronization can occur, the data signal received over a network must be processed in level and amplitude in order to permit binary information to be extracted. This adjustment needs to be accomplished in a very short period of time.

BRIEF SUMMARY OF THE INVENTION

The present invention provides a rapid synchronization or phase locking system to synchronize the receiving station clock to the sending station clock, useful with short data packets as are typically found in voice communication over shared networks. The system utilizes a local clock which is operated open loop at a rate substantially the same as the rate of the incoming data rate and capable of maintaining its phase accuracy with respect to the incoming data over an interval sufficient to accommodate the very short data packet. Synchronization or phasing of the local clock oscillator is accomplished by defining a range of time (or phase angle) within the interval of one bit in the incoming data within which phasing of the local oscillator will be considered acceptable for the short packet at a defined error rate. The range is typically chosen to be about a quarter of the bit length. Each bit of incoming data is checked against the local clock to see if it is phased to within the acceptable range. It if is not, the local clock is delayed or shifted, typically an amount of time close to the acceptable range, and the next data bit is checked for relative phasing within the range. Within four bit periods the system will be synchronized to within the acceptance criteria. In the case of a typical communication channel operating at 20 MHz, the time for synchronization to be achieved may be only 200 nanoseconds.

A Manchester code is typically utilized as the representation of the signal upon which synchronization is achieved. The Manchester code or biphase signal is recovered from the telecommunications network by a fast settling amplifier that rapidly establishes thresholding and level definition to accurately distinguish between high and low level signal levels in the Manchester code. The fast settling amplifier has an integrating feedback path that establishes a reference level for the binary state detection.

DESCRIPTION OF THE DRAWING

These and other features of the present invention are more fully set forth below in the solely exemplary detailed description and accompanying drawing of which:

FIGS. 2A, 2B, 2C', 2C'' and 2D are waveform diagrams useful in understanding the invention;

DETAILED DESCRIPTION OF THE DISCLOSURE

The present invention contemplates a fast settling amplifier to detect binary levels in data signals received by a system for phase synchronizing a local clock to the received data signals.

Figure 1:
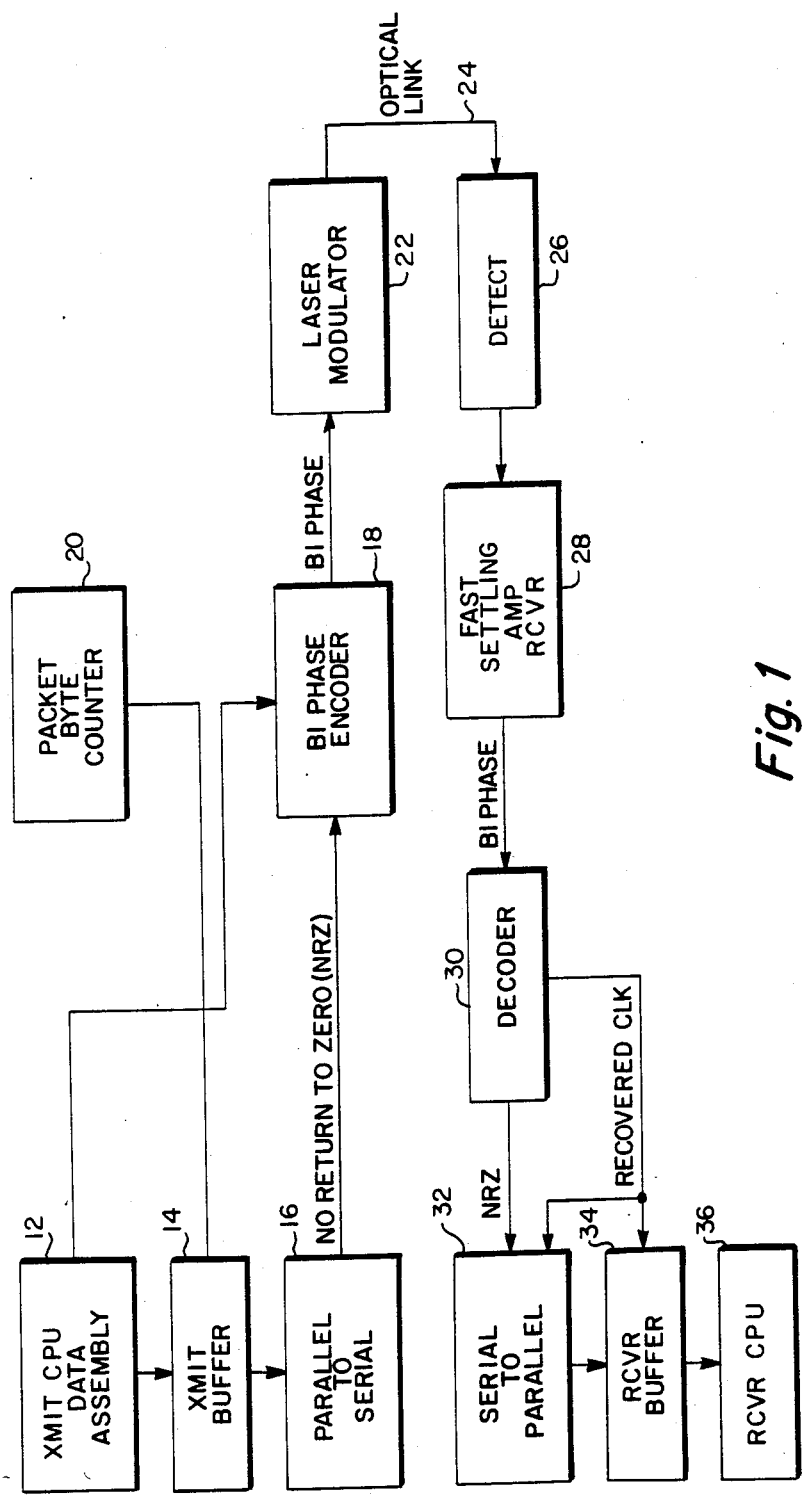
FIG. 1 is a system block diagram according to the invention.

An overall communication system illustrating the invention is shown in FIG. 1. At the data transmission side of the communication system the transmitter portion of a central procesing unit 12 acts to assemble data according to a predetermined data format. A buffer 14 provides time buffering between the assembled data and the real time continuous data output stream. The real time data output stream begins wtih a parallel-to-serial converter 16 which is triggered by a network sharing control system, not shown, but which may be of any conventional form permitting time shared access over a communication link. the data from the transmit buffer 14 is assembled into a serial bit stream, preferably a nonreturn to zero format so that intervals of actual data signal, be it a binary zero or one, can be distinguished from quiescent intervals of no signal content. The nonreturn to zero signal is applied to a biphase encoder 18 which formats the zeros and ones in the nonreturn to zero binary signal into a biphase signal as illustrated in FIGS. 2A and 2B. The biphase signal comprises, in each bit interval, both a high level and a low level signal, with the transition therebetween occurring at mid bit. Where the bit is to represent a binary zero, the biphase transmits first the high and then the low signal level while for a representation of a binary one, the bit contains first the low value followed by the high value.

A packet byte counter 20 controls the buffer 14 to process a predetermined number of bytes for encoding and transmitted through the biphase encoder 18. When the predetermined number of bytes, for examples 80 bytes, has been counted the online real time data stream provided from the transmit buffer 14 through the parallel-to-serial converter 16 is interrupted and the encoder 18 disabled by CPU 12 to permit the communication link to handle another communication packet from a different pair of transmit and receive stations as is known in the art of telecommunications.

The biphase encoded signal from the encoder 18 is applied to a laser modulator 22 which in turn modulates the biphase signal onto a light beam which is transmitted along an optical link 24, whcih may include one or more couplers to provide networking of a plurality of stations, to an optical detector 26. Detector 26 converts the light to a signal applied to a fast settling amplifier-receiver 28 that accommodates a wide dynamic range and rapidly distinguishes between the high and low level signals. The amplified biphase signal is applied to a decoder 30 from which a nonreturn to zero binary signal is recovered and applied to a serial-to-parallel interface circuit 32. Data from the serial-to-parallel interface is applied to a receiver buffer 34 and from the buffer 34 to a a local processing unit 36 which directs the data to its ultimate utilization, typically in the case of voice communication, conversion from digital to analog form for assembly in real time sequence for application to a listener.

Figure 3:
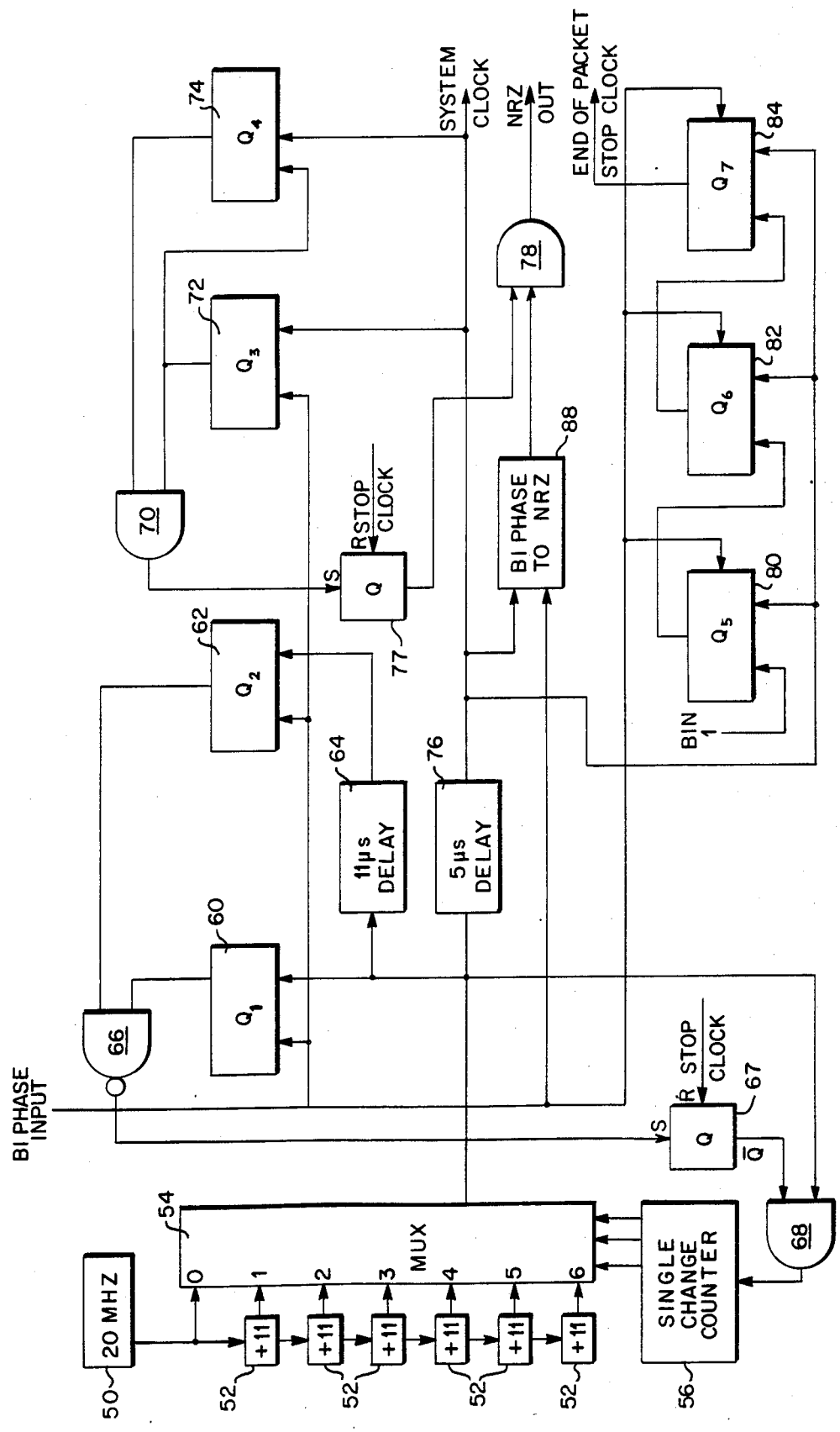
FIG. 3 is a circuit diagram of the decoder portion of the invention represented by FIG. 1.

The decoder 30 also generates a clock signal which is applied to the interface 32 and buffer 34 providing proper time framing for the nonreturn to zero signals so as to identify appropriate bit intervals. The decoder 30, the circuit details of which are shown in FIG. 3, operates to synchronize a local oscillator or clock within the decoder to the bit timing of the incoming biphase signal so that the biphase high and low level signals can be properly decoded with the result that the bits and bytes of the nonreturn to zero signal will be properly framed throughout the further signal processing by the serial-to-parallel converter 32, receiver buffer 34, and processor 36.

The synchronization established by the decoder 30 is accomplished within the first four bit intervals within one of the first few bytes of each transmitted data packet. For purposes of the present, exemplary implementation of the invention, the first bytes of data are a series of six binary zeros followed by a series of two binary ones as represented by FIG. 2A. The biphase encoded representation of this binary signal is illustrated in FIG. 2B. Each bit interval has a duration of 50 nanoseconds corresponding to a 20 MHz data rate. A binary zero is represented in the biphase (or Manchester) code as a high level signal for the first 25 nanoseconds followed by a low level signal for the second 25 nanoseconds of each bit interval. A binary one is the reverse.

A set of sampling signals have the waveforms represented in FIGS. 2C' and 2C''. The leading edges of the two waveforms are separated by an interval of 11 nanoseconds which occurs randomly within the bit frame when the first byte of data in each packet is received. Within a maximum of four bit intervals, the clock signal represented by FIGS. 2C' and 2C'' is synchronized in accordance with the present invention so that the 11 nanosecond interval occurs reliably within a range of time in the first 25 nanoseconds of each bit interval as illustrated in the last three bit intervals of FIGS. 2C' and 2C''. The center point of the 11 nanoseconds interval, representing the actual system clock time, is represented in FIG. 2D.

The synchronization criteria in the present invention requires that the leading edge of the sampling clock pulses of FIGS. 2C' and 2C'' both occur during the intial 25 nanoseconds of each bit interval in the biphase signal of FIG. 2B. This is to some extent an arbitary criteria and greater separations may be selected, and indeed the criteria could be such that the leading edges must be detected in opposite lvels of the biphase signals if they were appropriately time separated. FIGS. 2C' and 2C'' represent the worst case of initial phasing between the local clock signal and the incoming data stream represented in FIG. 2B. The first bit interval illustrates the first leading edge falling into the first 25 nanoseconds while the second leading edge occurs in the last 25 nanoseconds. The circuitry of FIG. 3, to be described below, detects this missynchronization and shifts the clock by 11 nanoseconds before the reception of the second bit. As can be seen from FIGS. 2C' and 2C'', the second bit interval, with the clock delayed by 11 nanoseconds, will also fail to achieve synchronization since both leading edges will not occur in the initial 25 nanoseconds. In the third bit interval, the clock has been delayed another 11 nanoseconds; and in this case both leading edges are in the second 25 nanoseconds. In the fourth bit interval, the leading edges span a bit interval. Finally, in the fifth bit interval, after only four bit intervals have passed, the clock as been shifted a total of 44 nanoseconds from the original timing and the leading edges will occur at the 9th and 20th nanoseconds respectively. This condition represents synchronization.

As can be perceived from the operation illustrated with respect to FIGS. 2C' and 2C'', proper synchronization, that is leading edges occurring within the first 25 nanoseconds, when the biphase binary signal level is high, can occur within a range which is represented by the interval of one-half of a bit minus the interval between the leading edges of the clock sampling signal. In the case where the edges are separated by 11 nanoseconds, and rejecting the condition of coincident transitions, the range is approximately 12 nanoseconds, comparable to the distance between the leading edges.

The actual clock signal is defined at a position by approximately one-half of the distance between the leading edges, which in this case is 5 nanoseconds. This insures that the clock pulse will not be so close to the beginning or middle of a bit interval in the incoming data as to permit a significant risk of error. There are tradeoffs in the adjustment between the size of the acceptance range for synchronization and the time between the leading edges. By making them approximately equal as indicated here, there is a reasonable tradeoff between the length of time or numbers of bit intervals necessary to secure synchronization in the worst case, which improves with increased range, and the certainty in detection by locating the actual clock time within a relatively narrow portion of the first 25 nanoseconds.

The shift interval of 11 nanoseconds is selected so that there are not an integral number of shifts within a bit interval. This insures that the clock will never recycle to the same position. Thus, if by chance, a leading edge of the sampling signal occurred exactly at a transition in the biphase signal, that coincidence would be lost after cycling through four or five bits.

The specific circuitry utilized for providing decoding of the biphase signal is illustrated with respect to FIG. 3. As shown there, a 20 MHz clock or local oscillator 50 has its output signal applied through a succession of 11 nanosecond delay circuits 52. The output of each delay circuit 52 is applied to a distinct input of a multiplexer 54. The multiplexer 54 is controlled by a counter 56, of a design which produces a single bit transition between each count state to avoid the possibilty of clitch ambiguities from multiple transitions. The counter 56 controls which of the delayed inputs from the delay circuits 52 will be provided as a clock output by multiplexer 54. In this manner the clock signal from the 20 MHz clock 50 can be successively delayed or advanced in 11 nanosecond steps.

The incoming biphase signal is applied within the decoder circuitry to data inputs of first and second flip-flops 60 and 62. The output of the multiplexer 54 is applied to the clock input of the first flip-flop 60 and, after an 11 nanosecond delay in a delay circuit 64, to the clock input of the second flip-flop 62. The delay circuit 64 essentially establishes the interval between leading edges of the sampling signal of FIGS. 2C' or 2C''.

The state outputs of the flip-flops 60 and 62 are applied through an NAND gate 66 whose output is in turn applied to set a register 67 that in turn controls one input of an AND gate 68. Gate 68 advances counter 56 to shift the clock in 11 nanosecond steps through multiplexer 54. The AND gate 68 also receives a clock input from multiplexer 54 defining a single shift with each bit, interval. When both flip-flops 60 and 62 detect the high level biphase signal at 11 nanosecond intervals, register 67 is set, freezing the AND gate 68 from further advances on counter 56.

The biphase input signal is applied to the data input of a first flip-flop 72 while the output of that flip-flop is applied as the data input to a second flip-flop 74. Both flip-flops 72 and 74 are clocked by the output of the multiplexer 54 after a 5 nanosecond delay in a delay circuit 76.

In operation, the flip-flops 72 and 74 detect the initial occurrence of the stream of binary zeros used for synching and set the inputs to an AND gate 70, in turn setting a register 77 enabling one input of an AND gate 78.

The biphase signal is also applied to clear inputs of a further set of flip-flops 80, 82 and 84. The delayed clock output from the delay circuit 76 is applied to the clock inputs of the flip-flops 80, 82 and 84. The data input of the flip-flop 80 is set at binary 1 while the flip-flops 82 and 84 receive data inputs from the state output of the preceding flip-flop in this series. The state output of the flip-flop 84 will be at binary 1 if there is a lack of any signal for at least three bit intervals. Its output functions as a system reset or stop signal which is applied to reset the counter 56 and registers 67 and 77. Because the biphase signal insures a high signal during at least a half of the bit interval during signal transmission, the presence of three bit intervals with no signal is an indication of the termination of the packet.

The conversion from the biphase to a nonreturn to zero signal is accomplished by a converter 88 functioning in a conventional manner. Its output, the nonreturn to zero signal, is applied through an AND gate 78 when initial binary zeros are detected to the serial-to-parallel converter 32 as discussed above.

The clock 50 is selected to have a frequency stability sufficient to insure maintenance of synchronization over the short data packet length of typically 80 bytes, or at 50 nanoseconds per bit, typically 32 microseconds per packet. With currently available oscillator circuitry it is possible to specify and obtain oscillators 50 which have sufficient frequency accuracy and stability to stay in sync within the parameters for synchronization discussed above, reliably over the 32 microsecond range, and substantially greater. By running open loop after a course range synchronization, as discussed above, very rapid synchronization, requiring at most 200 nanoseconds of the 32 microsecond data package, is readily achievable. This permits efficient channel sharing for real time transmission such as in voice communication requiring a conversational quality that precludes the loss of coherency that would otherwise result with long data packets.

Figure 4:
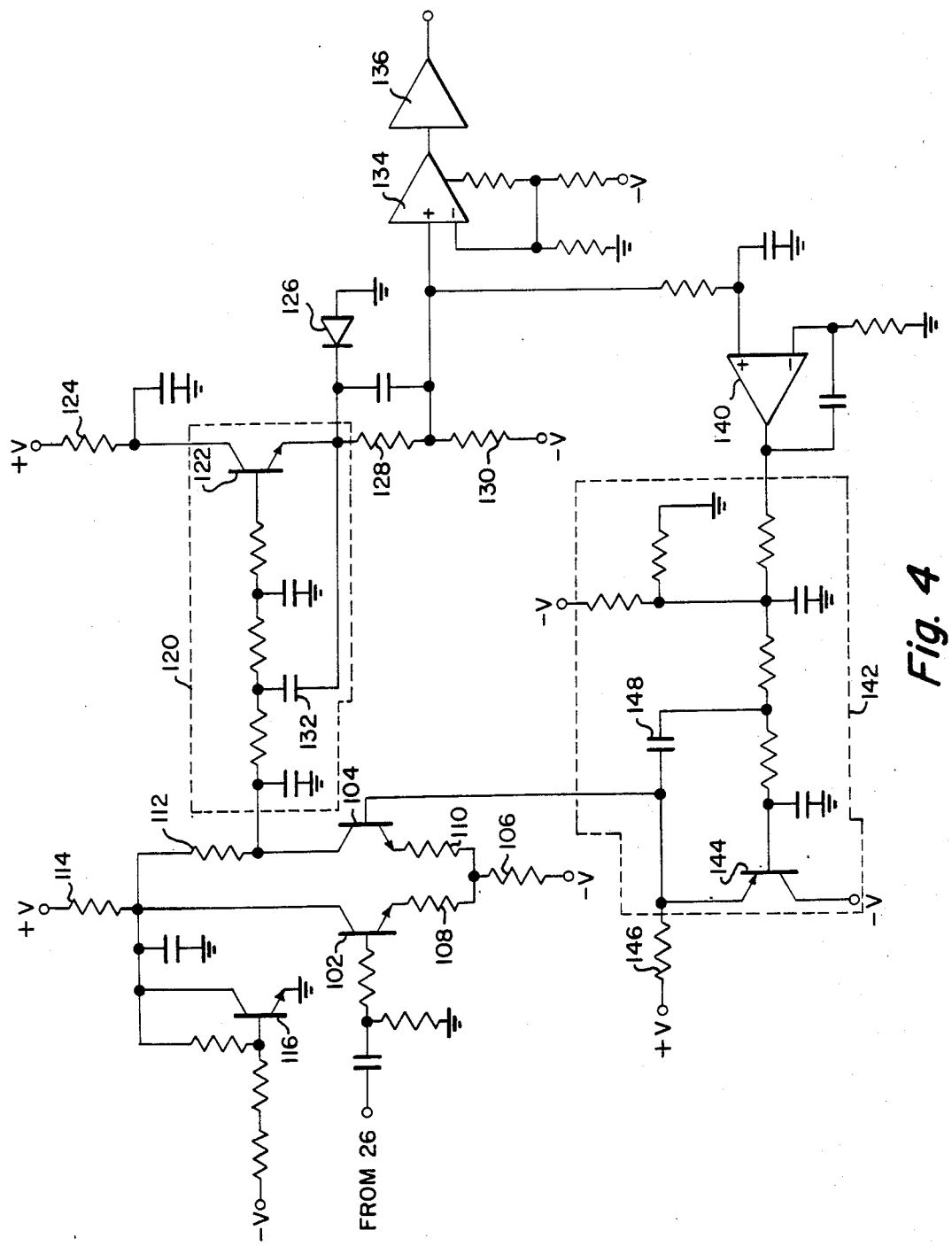
FIG. 4 is a circuit diagram of the fast settling amplifier receiver of FIG. 1.

The fast settling amplifier receiver 28 illustrated in FIG. 1 is more fully illustrated with respect to FIG. 4. Since the incoming biphase or Manchester code signal has two nonzero signal states, a high and a low signal level, the fast settling amplifier must rapidly identify whether a given signal level is a high or low level in order for the present invention to permit rapid phase locking to a data burst. Since the range of acceptable signal levels can be very large, the incoming signal level representing the lower level may, for strong signals, be above the signal level representing the high level state for incoming signals of low signal strength. The amplifier and receiver 28, as more completely illustrated in FIG. 4, rapidly responds to the incoming signal to establish a discrimination threshold so as to accurately identify the low level and high level components of the incoming Manchester, biphase signal.

The input signal from the detector 26 is AC coupled to the base of a suitably biased transistor 102 connected in a differential arrangement with a transistor 104, sharing a common emitter resistor 106 through independent emitter resistors 108 and 110, respectively. The collector of the transistor 104 is supplied through a resistor 112 from the positive power supply, via a decoupling resistor 114. This same signal is applied to the collector of the transistor 102 and is regulated by a transistor 116 driven at its base from the negative voltage supply.

The collector of the transistor 104 is connected to a low-pass Sallen & Key filter 120 and through a resistor path to the base of a transistor 122 in the filter 120. The collector of transistor 122 is powered through a decoupling resistor 124 from the positive supply voltage. The emitter output is clamped by a diode 126 to protect the subsequent comparator circuitry from excessive negative voltages. Resistors 128 and 130 connect the emitter to the negative voltage supply and provide a level shift through resistor 128 for application to comparator 134, allowing signal levels in filter 120 to be high for reasonable swings at transistor 122. A capacitor 132 is driven from the emitter of the transistor 122 coupling into the center of the filter 120 in the Sallen & Key configuration. The low-pass filter 120 typically has a 30 MHz cutoff point that represents 1.5 times the data rate and is configured on a Bessel function optimization of the signal-to-noise ratio for a Manchester code. The transistor 122 operates as an emitter follower, and the emitter base diode provides a level shift in the emitter follower output which is applied to a noninverting input of a high speed comparator 134. The output of the comparator 134 is applied to a line driver 136 which in turn provides buffering for the output signal to be applied to the decoder 30 of FIG. 1.

The emitter follower output from the transistor 122 is applied to an integrator 140 which in turn drives a low-pass, three pole Sallen & Key filter 142, typically having a cutoff point sufficient to attenuate ripple while maintaining fast settling. This signal is applied within the filter 142 to the base of a transistor 144. The collector of transistor 144 is driven by the negative voltage supply while the emitter is driven through a resistor 146 from the positive voltage supply. The emitter signal is fed back through a capacitor 148 in the Sallen & Key configuration and is applied to the base of the transistor 104.

The integrator 140 and low-pass filter 142 establish a threshold signal level which is applied to the base of the transistor 104 and which tracks the average value of the biphase input signal. Since each binary digit in the biphase signal has effectively an equal time of high signal level and low signal level, the DC average will settle and maintain a value approximately half way between the high and low level signals. This threshold, as applied to the transistor 104, sets a reference value for the differential amplifier consisting of the transistors 102 and 104 and adjusts the average level at the output of the collector 104 so that the incoming high and low signal levels span a preselected average. This signal is low-pass filtered to remove high frequency transients and level shifted in the transistor 122 and its emitter components before application to the comparator 134. Comparator 134 effectively squares up the signal into a conventional appearing biphase signal format.

The circuitry of FIG. 4 utilizes level shifting rather than gain adjustment to provide more reliable and noise-free, fast attack capabilities for accomplishing the signal level normalization required in the present system. The integrated and filtered feedback signal provides a fast attack speed with minimal ripple, and additionally insures an accurate threshold level after settling. The filter 142 is a sharp cutoff filter that facilitates these effects. The inclusion of some filtration in both the signal and feedback paths also advances these objectives. Settling within a short data interval is achieved.

The specific implementation illustrated above is exemplary only, the scope of the invention being solely as indicated in the following claims.

What is claimed is:

1. A fast settling amplifier for recovering two level digital signals from a communication network comprising:

means for receiving dual level signals from a communication network;

means for amplifying said dual level signals about a reference signal level which reference signal level is representative of a point midway between said dual signal levels;

comparator means for providing said two level digital signals from said amplified dual level signal;

feedback path means responsive to the amplfied dual level signals for establishing said reference signal level including;

an integrator receiving said amplified dual level signal and providing an integrated amplified dual level signal; and a feedback low pass filter receiving said integrated amplified dual level signal to remove signal ripple therefrom, and providing a signal to said means for amplifying at said reference signal level.

2. The system of claim 1 wherein said receiving means is adapted to receive a biphase or Manchester code signal.

3. The system of claim 2 wherein said means for amplifying includes differential amplifier means receiving on one input said received biphase signal and on a second input a signal corresponding to said reference signal level.

4. The system of claim 2 further including means for low-pass filtering said amplified signal;

said reference signal being developed from said low-pass filtered amplified signal.

5. The system of claim 4 further including means for level shifting said low-pass filtered signal;

said reference signal being developed from said level shifted low-pass filtered signal.

6. The system of claim 1 further including:

differential amplifier means comprising said amplifier means responsive on one input to said received signal and on a second input to a signal representative of said reference threshold.

7. A fast settling amplifier for recovering two level digital signals from a communication network comprising:

means for receiving dual level signals from a communication network;

means for amplifying said dual level signals about a reference signal level which reference signal level is representative of a point midway between said dual signal levels;

means for wave shaping the amplified dual level signals to provide an output therefrom;

means responsive to the amplified dual level signal for establishing said reference signal level;

first low pass filter means for providing low pass filtering of said amplified dual level signal before application to said wave shaping means, wherein said means for establishing includes:

means for providing an integration function of the amplified dual level signal after low pass filtering by said first low pass filter;

second low pass filter means for providing low pass filtering of the output signal from the means for providing an integration function, providing said reference signal to said means for amplifying.

8. The amplifier of claim 7 wherein said first and second low pass filters are Sallen & Key filters.

9. The amplifier of claim 8 wherein said second low pass filter is a three pole Sallen & Key filter.

10. The system of claim 7 further including level shift means for shifting the filtered amplified dual level signal for application to said means for signal shaping.

11. The amplifier of claim 7 wherein said first low pass filter has a cutoff frequency at approximately one and one-half times the rate of data in said received dual level signal.

* * * * *